United States Patent [19]

Kawaguchi et al.

[11] 4,128,815

[45] Dec. 5, 1978

[54] SINGLE TRANSVERSE MODE OPERATION IN DOUBLE HETEROSTRUCTURE JUNCTION LASER

[75] Inventors: Hitoshi Kawaguchi, Higashi Yamato; Yoshitaka Furukawa, Musashino, both of Japan

[73] Assignee: Nippon Telegraph and Telephone Public Corp., Tokyo, Japan

[21] Appl. No.: 725,777

[22] Filed: Sep. 23, 1976

[30] Foreign Application Priority Data

Oct. 7, 1975 [JP] Japan .................................. 50-121162

[51] Int. Cl.² ............................................... H01S 3/19
[52] U.S. Cl. ................................... 331/94.5 H; 357/18
[58] Field of Search ..................... 331/94.5 H; 357/16, 357/18

[56] References Cited

U.S. PATENT DOCUMENTS 3,958,265  5/1976  Charmakadze et al. ................. 357/18
3,993,964  11/1976  Yonezu ............................ 331/94.5 H

OTHER PUBLICATIONS

T. P. Lee et al., "Al$_x$Ga$_{1-x}$As Double-Heterostructure Rib-Waveguide Injection Laser", *IEEE Journal of Quantum Electronics*, vol. QE-11, No. 7, pp. 432-435, Jul. '75.
H. Furtuta et al., "Novel Optical Waveguide for Integrated Optics", *Applied Optics*, vol. 13, No. 2, Feb. 1974, pp. 332-326.
V. Ramaswany, "Strip-Loaded Film Waveguide", *The Bell System Technical Journal*, vol. 53, No. 4, Apr. 1974, pp. 697-704.
S. Iida et al., "Spectral Characteristics and Inhomogeneities Near Active Regions of Double-Heterostructure . . . Configuration", *Japanese J. of App. Phys.*, vol. 13, No. 8, Aug. 1974, pp. 1249-1258.
Ripper et al., "Stripe-Geometry Double Heterostructure Junction Lasers: Mode Structure and CW Operation Above Room Temperature", *Applied Physics Letters*, vol. 18, No. 4, Feb. 15, 1971, pp. 155-157.
Casey, Jr. et al., "GaAs—Al$_x$Ga$_{1-x}$As Heterostructure Laser With Separate Optical and Carrier Confinement," *Journal of Applied Physics*, vol. 45, No. 1, Jan. 1974, pp. 322-333.

*Primary Examiner*—Stanley D. Miller, Jr.
*Assistant Examiner*—James W. Davie
*Attorney, Agent, or Firm*—Leydig, Voit, Osann, Mayer & Holt, Ltd.

[57] ABSTRACT

In single transverse mode semiconductor lasers, a semiconductor laser which comprises an optical confinement semiconductor layer having a refractive index of $n_3$, an active layer of an optical waveguide having a refractive index of $n_1$ and formed on said semiconductor layer, a buffer layer having a refractive index of $n_2$ and formed on said active layer, a mode controlling striped semiconductor layer having a refractive index of $n_6$ and formed on said buffer layer and opposing contacts, and is controllable in the transverse mode in the relations of $n_6 \leq n_2 < n_1$ and $n_3 < n_1$.

15 Claims, 15 Drawing Figures

SINGLE TRANSVERSE MODE OPERATION IN DOUBLE HETEROSTRUCTURE JUNCTION LASER

This invention relates to single transverse mode lasers and, more particularly, to a smeiconductor laser controllable in the transverse mode by means of an optical waveguide.

Semiconductor lasers of double heterostructure of GaAs — $Al_xGa_{1-x}As$ have been noticeable because of their capability of being continuously osicllated at the room temperature and currently coming to be practiced with their elongation in life. In using the semiconductor laser as a light source for optical communication using a single mode fiber, it is necessary that the oscillated wave length width should be narrow in order to reduce the strain of pulses by the dispersion of the material of the fiber, and the single stabilization of a longitudinal mode is necessary. Further, if a coupling to the single mode fiber is considered, the semiconductor laser will be required to be made single in the transverse mode.

Double heterostructure lasers with stable fundamental oscillation in the transverse mode in the direction perpendicular to the p-n junction (the y direction) are known. However, adequate stability in the transverse mode in the direction parallel to the p-n junction (the x direction) has not been obtained. A general method of making the transverse mode in the direction parallel to this p-n junction to be single is to make a pumping current flow in the form of a stripe of about 10 $\mu$m so as to stripe the oscillation region. A laser of this kind of formation is suggested in an article titled "Mesa-Stripe-Geometry Double-Heterostructure Injection Lasers" by T. Tsukada et al. in IEEE Journal of Quantum Electronics, Vol. QE - 9, No. 2, February 1973, pages 356–361. In this formation, there is shown a so-called low mesa stripe laser wherein respective layers until just above the active layer are etched and an electric current is made to flow only to the mesa region. It is known that, when the layers until just above the active layer are etched, current spread will be reduced, oscillation will occur only in the active layer below the mesa stripe region; and the lowest transverse mode oscillation will be obtained near the threshold current, but with the rise of the operating current, a higher transverse mode oscillation will occur and no stabilized characteristics will be obtained. Further, in U.S. Pat. No. 3,883,821 granted May 13, 1975 to S. E. Miller, there is suggested a double heterostructure junction laser in which a part of the active layer is made thick in the form of a stripe so as to form an optical waveguide.

The present invention has been suggested by taking these respects into consideration and, according to the present invention, the single transverse mode semiconductor laser comprises a semiconductor substrate having a first conduction type, an optical confinement semiconductor layer of the first conduction type having a refractive index of $n_3$ and formed on said semiconductor substrate, an optical waveguide active semiconductor layer having a refractive index of $n_1$ and formed on said optical confinement semiconductor layer, a buffer semiconductor layer of a second conductive type having a refractive index of $n_2$ and formed on said optical waveguide active semiconductor layer, a mode controlling striped semiconductor layer of the second conduction type having a width $a$ and a refractive index of $n_6$ and provided on said buffer semiconductor layer, a contact forming semiconductor layer of the second conduction type provided on said striped semiconductor, a first ohmic contact provided on said contact forming semiconductor layer, and a second ohmic contact provided on the bottom surface of said substrate, wherein respective said refractive indexes of the respective semiconductor layers being in the relations of $$n_6 \leq n_2 < n_1 \text{ and } n_3 < n_1.$$

In accordance with the invention, the striped mode controlling semiconductor and buffer semiconductor layers produce a specific refractive index difference $\Delta n$ in the optical waveguide layer of the laser, and this specific refractive index difference is utilized to effect a single transverse mode that is stable.

A primary object of the present invention is to provide a semiconductor laser controllable in the transverse mode.

Another object of the present invention is to provide a semiconductor laser controllable in the transverse mode.

Another object of the present invention is to provide a semiconductor laser easy to manufacture.

A further object of the present invention is to provide a semiconductor laser in which mode variation due to current fluctuation is little.

Another object of the present invention is to provide a semiconductor laser that enables fabrication of a laser device of a single mode and large output.

A further object of the present invention is to provide a semiconductor laser of a long life.

The present invention shall be detailed in the following with reference to certain preferred embodiments shown in accompanying drawings, in which:

FIGS. 6A and 6B and FIGS. 7A and 7B are diagrams showing the transverse mode characteristics of the laser according to the present invention with different operating currents, wherein FIGS. 6A and 6B are of near-field pattern and FIGS. 7A and 7B are of far-field pattern.

Figure 1:
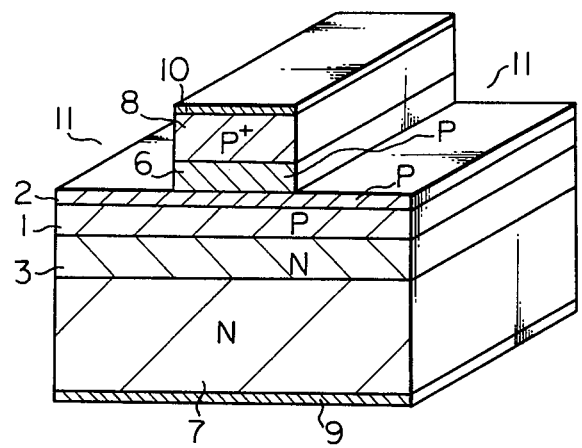
FIG. 1 is a perspective view of an embodiment of the semiconductor laser according to the present invention.

Referring now to FIG. 1, a p-type buffer semiconductor layer 2 (the second semiconductor layer) of a refractive index of $n_2$ is provided on one side of a p-type active semiconductor layer 1 (the first semiconductor layer) of a refractive index of $n_1$ and acting as an optical waveguide, a mode controlling striped p-type semiconductor layer 6 of a refractive index of $n_6$ is provided on the buffer layer 2, a contact forming p$^+$-type semiconductor cap layer 8 is provided on the mode controlling semiconductor layer 6 and an ohmic contact 10 is formed on the contact forming semiconductor cap layer 8. Further, an opticl confinement n-type layer 3 (the third semiconductor layer) of a refractive index of $n_3$ is provided on the other side of the active layer 1, an n-type substrate 7 is arranged on the optical confinement layer 3 and an ohmic contact 9 is formed on the substrate 7. Optical resonator is formed of cleaved surfaces opposing in parallel to each other. Air 11 is around the buffer layer 2 and mode controlling semiconductor layer 6 and, if the refractive index of air is represented by $n_{11}$, $n_{11} = 1$. Here, it is necessary that the relations of $$\left. \begin{array}{l} n_6 \leqq n_2 < n_1 \\ n_3 < n_1 \end{array} \right\} \quad (1)$$

should be kept between the respective refractive indexes.

Figure 2:
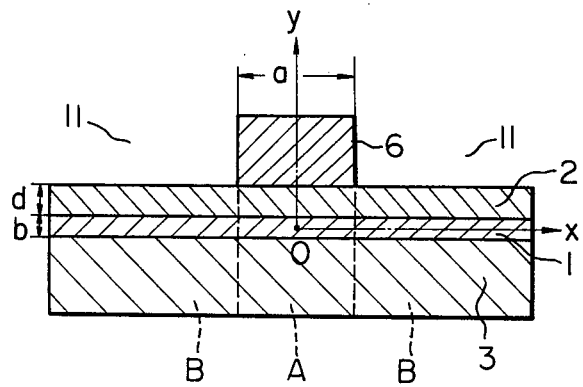
FIG. 2 is a schematic sectioned view showing an optical waveguide approximated to the structure of FIG. 1.

In order to clarify the characteristics of the above optical waveguide, an optical waveguide of the structure as in FIG. 2 shall be considered. In the drawing, 1 is an optical waveguide, 2 is a buffer layer, 3 is an optical confinement layer and 6 is a mode controlling striped semiconductor layer. A light will be well attenuated in the optical confinement layer 3 and mode controlling semiconductor layer 6, so that the semiconductor substrate 7 and contact forming semiconductor cap layer 8 in the structure of FIG. 1 will not be optically influenced. Therefore, the structure of FIG. 2 is a very good approximation to the structure of FIG. 1. The propagating mode characteristics of the optical waveguide shown in FIG. 2 can be calculated to a good approximation by using an equivalent refractive index difference method disclosed in an article "Novel Optical Waveguide for Integrated Optics" of "Applied Optics" 13 (1974) Vol. 13, 1974, page 322.

In FIG. 2, the optical waveguide 1 is considered to be divided into a region A and two regions B. The region A is a part below the mode controlling striped semiconductor layer 6 in the optical waveguide 1. The regions B are parts corresponding to parts below air of a refractive index of $n_{11} = 1$. The thickness of the optical waveguide 1 is represented by b, the thickness of the buffer layer 2 is represented by d and the width of the striped semiconductor layer is represented by a. The thickness b of the optical waveguide is so small (for example, 0.2 to 0.5 μm) as compared with the stripe width a (for example, 5 to 10 μm) that the aperture is rectangular. In such case, the mode can be considered as divided in the directions x and y. When the propagation constants $\beta_A$ and $\beta_B$ respectively of the regions A and B are considered, the mode may be handled as a TE mode.

$\beta_A$ is the propagaption constant of a four-layer film optical waveguide consisting of $n_3$ - $n_1$ - $n_2$ - $n_6$, whereas $\beta_B$ is the propagation constant of a four-layer film optical waveguide consisting of $n_3$ - $n_1$ - $n_2$ - $n_{11}$.

The respective propagation constants are determined by substituting boundary conditions in the following Maxwell equations:

$$\nabla \times H = \epsilon_o n^2 (\delta E / \delta t)$$
$$\nabla \times E = -\mu_o (\delta H / \delta t)$$

wherein $\epsilon_o$ and $\mu_o$ are respectively a dielectric constant and permeability of a vacuum, and n is a refractive index of a medium. In this case, as they are infinite in the direction x, $\delta/\delta x = 0$ may be made.

$$b \times \gamma_A = \tan^{-1} \sqrt{\frac{k_o^2(n_1^2 - n_3^2)}{\gamma_A^2} - 1} + \quad (2)$$

$$\tan^{-1} \left\{ \eta_A \sqrt{\frac{k_o^2(n_1^2 - n_6^2)}{\gamma_A^2} - 1} \right\} + m_A \pi \quad (3)$$

$$b \times \gamma_B = \tan^{-1} \sqrt{\frac{k_o^2(n_1^2 - n_3^2)}{\gamma_B^2} - 1} +$$

$$\tan^{-1} \left\{ \eta_B \sqrt{\frac{k_o^2(n_1^2 - n_{11}^2)}{\gamma_B^2} - 1} \right\} + m_B \pi$$

wherein the mode number $m_A = 0, 1, 2, \ldots$ and $m_B = 0, 1, 2, \ldots$

Here, $\eta_A = \left( \frac{\sigma_{2A}}{\sigma_6} \right) \frac{1 + T_A}{1 - T_A}$, $\eta_B = \left( \frac{\sigma_{2B}}{\sigma_{11}} \right) \frac{1 + T_B}{1 - T_b}$, $T_A = \frac{\sigma_6 - \sigma_{2A}}{\sigma_6 + \sigma_{2A}} e^{-2\sigma_{2A} \times d}$, $T_B = \frac{\sigma_{11} - \sigma_{2B}}{\sigma_{11} + \sigma_{2B}} e^{-2\sigma_{2B} \times d}$, $\sigma_{2A} = \sqrt{k_o^2(n_1^2 - n_2^2) - \gamma_A^2}$, $\sigma_{2B} = \sqrt{k_o^2(n_1^2 - n_2^2) - \gamma_B^2}$, $\sigma_6 = \sqrt{k_o^2(n_1^2 - n_6^2) - \gamma_A^2}$, $\sigma_{11} = \sqrt{k_o^2(n_1^2 - n_{11}^2) - \gamma_B^2}$, and $\beta_A = \sqrt{k_o^2 n_1^2 - \gamma_A^2}$, $\beta_B = \sqrt{k_o^2 n_1^2 - \gamma_B^2}$.

The values obtained by standardizing $\beta_A$ and $\beta_B$ with the propatation constant $k_o$ of a plain wave in air whall be $n_A$ and $n_B$:

$$n_A = \beta_A/k_o \text{ and } n_B = \beta_B/k_o.$$

When the propagation constants are thus different in the regions A and B, a reflection will occur in the boundary. The reflection between the regions A and B may be considered to be uniform in the direction y. Then, the refractive index of the region A may be made $n_1$ and the equivalent refractive index of the region B is given by:

$$n_e = \sqrt{n_1^2 - n_A^2 + n_B^2}.$$

Therefore, $$\Delta n = \frac{n_1 - n_e}{n_1} = 1 - \sqrt{1 - \frac{n_A^2 - n_B^2}{n_1^2}} \quad (4)$$

In the optical waveguide having such specific refractive index difference, from the Maxwell equations, the cut off guide width a of the "m"th mode is $$a_{m \, max} = \frac{m\pi}{k_o \sqrt{n_1^2 - n_e^2}} \quad (5)$$

where $m = 1$, $$a_{1 \, max} = \frac{\pi}{k_o \sqrt{n_1^2 - n_e^2}}$$

$$= \frac{\lambda_o}{2n_1 \sqrt{2\Delta n}}$$

wherein $\lambda_o$ is a wave length in a free space of a propagated light, $n_1$, is the refractive index of the first semiconductor and $\Delta n$ is an equivalent specific refractive index difference.

Therefore, if the width $a$ of the striped semiconductor layer 6 is smaller than $a_{max}$ represented by the formula (5), the optical waveguide will be a single mode optical waveguide through which only the fundamental mode propagates.

Figure 3:
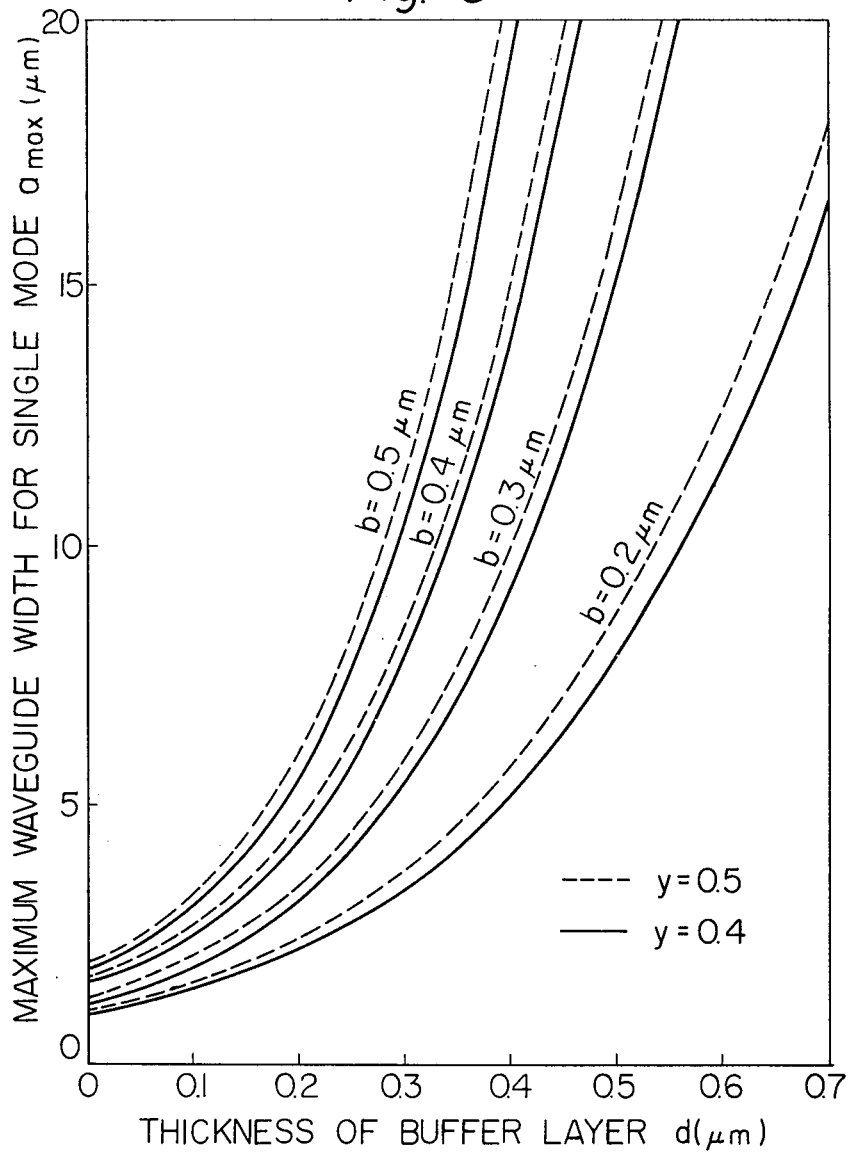
FIG. 3 is a diagram showing relations between the thickness of buffer layer and the maximum waveguide width for single mode operation.

The equivalent refractive index difference $\Delta n$ varies with the thickness $d$ and refractive index $n_2$ of the buffer layer 2, the thickness $b$ of the optical waveguide 1 and the refractive index $n_6$ of the mode controlling striped semiconductor layer 6. This state is shown in FIG. 3.

The curves shown in FIG. 3 were obtained from such a sample as follows:

Optical waveguide 1: GaAs, $n_1 = 3.62$
Buffer layer 2: $Al_{0.2}Ga_{0.8}As$, $n_2 = 3.48$
Optical confinement layer 3: $Al_{0.3}Ga_{0.7}As$, $n_3 = 3.41$
Mode controlling semiconductor layer 6: $Al_yGa_{1-y}As$,
wherein,
when $y = 0.4$, $n_6 = 3.35$ and
when $y = 0.5$, $n_6 = 3.29$
Air 11: $n_{11} = 1$ Referring now to FIG. 3, the thickness $d$ of the buffer layer 2 is taken on the abscissa and the maximum width $a_{max}$ of the optical waveguide possible by the single mode only is shown on the ordinate. As a parameter, the thickness $b$ of the active layer 1 is taken and four different thickness $b = 0.2$ to 0.5 $\mu$m are shown. Further, the values of $y$ of the mode controlling semiconductor layer $Al_yGa_{1-y}A$ are shown in solid lines in case $y = 0.4$ and in broken lines in case $y = 0.5$. The representations by the solid lines and dotted lines are respectively the same also in case the thickness $b$ is 0.5, 0.4 and 0.3 $\mu$m. It should be noted that this diagram is of the case of an $E^x$ mode at an oscillated wave length $\lambda = 0.85$ $\mu$m of the semiconductor laser.

It is understood from this diagram that, when the thickness of the optical waveguide 1 is $b = 0.3$ $\mu$m and the thickness of the buffer layer 2 is $d = 0.4$ $\mu$m, with the optical waveguide width of $a_{max} <$ about 8 $\mu$m, only the fundamental mode will be capable of propagation. In order to reduce the operating current in the semiconductor laser, it is generally necessary to reduce the thickness of the optical waveguide 1 to about 0.2 to 0.5 $\mu$m. Therefore, the light leakage from the optical waveguide 1 is so large that, in case there is no buffer layer 2 in the present invention, that is, in the so-called low-mesa stripe laser mentioned in the before described article of IEEE (when $d = 0$ in FIG. 3), the difference between $\beta_A$ and $\beta_B$ will be large and the equivalent specific refractive index difference $\Delta n$ will be about $3 \times 10^{-3}$ and, in order to form a single mode optical waveguide by the formula (4), the width of the optical waveguide must be made about 1 $\mu$m and the semiconductor laser will be very difficult to manufacture.

On the other hand, as shown in FIG. 3, it seems that, if the thickness $d$ of the buffer layer 2 is made larger, the width $a$ of the single mode optical waveguide 1 will be able to be made larger. But, as evident from the formula (4), the equivalent refractive index difference will become smaller, the wave guiding action will become weaker and the mode will be made unstable by the nonuniformity of the epitaxial film and variations in the poured current density. From the above results, in the present invention, the mode characteristics will be so greatly influenced by the variations in the thickness of the introduced buffer layer that it is necessary to sufficiently control the thickness of the buffer layer at the time of the growth of the liquid phase epitaxial film.

Considering of the stability of the mode and the ease of the operation, in the present invention, it is preferable that the thickness of the optical waveguide is selected to be 0.2 to 0.5 $\mu$m, the thickness of the buffer layer 2 to be 0.2 to 0.5 $\mu$m and the width $a$ of the optical waveguide is made about 3 to 8 $\mu$m and, more preferably, the thickness of the optical waveguide should be 0.3 $\mu$m, the thickness of the buffer layer be 0.4 $\mu$m and the width $a$ of the optical waveguide be 5 $\mu$m.

While the optical waveguide active layer has been explained with reference to GaAs in the foregoing it is also possible to use $Al_xGa_{1-x}As$ (wherein $0 < x \leq 0.1$) instead of GaAs. The reason why the composition of aluminum for the active layer is to be of $0 < x \leq 0.1$ is that, as the aluminum composition for the buffer layer is 0.2, the composition for the active layer is made smaller than that of the buffer layer so that the refractive index of the active layer will be larger than that of the buffer layer.

As a laser device, in the structure of FIG. 1, besides the ohmic contacts 9 and 10, the contact forming semiconductor cap layer 8 is of p-type GaAs, the mode controlling semiconductor layer 6 is of p-type $Al_yGa_{1-y}As$ (wherein $y = 0.4$ or 0.5), the buffer layer is of p-type $Al_{0.2}Ga_{0.8}As$, the active layer 1 of the optical waveguide is of n-type, p-type or compensated GaAs or AlGaAs, the optical confinement layer 3 is of n-type $Al_{0.3}Ga_{0.7}As$ and the substrate 7 is of n-type GaAs. In the above description, the p-type and n-type can be made entirely reverse to each other.

Further as the laser device, it is necessary to form a reflecting surface by cleavage or etching vertically to the optical waveguide layer and to p - n junction. If a voltage is applied in the forward direction to the above structure, a laser light of an oscillation of the basic mode will be able to be obtained.

An exemplary manufacture of the device according to the present invention shall be disclosed as follows.

Figure 4:
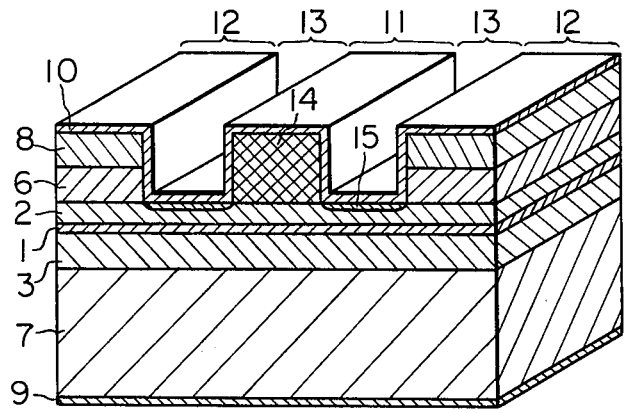
FIG. 4 is a perspective view of a laser according to the present invention.

In FIG. 4 showing a product as finished, 1 is the active layer of an optical waveguide, 2 is the buffer layer, 3 is the optical confinement layer, 14 is a p-type diffused layer, 6 is the mode controlling semiconductor layer. 7 is the substrate, 8 is the contact forming semiconductor cap layer, 9 and 10 are the ohmic contacts, 11 designates a mesa region, 12 designates bonding supports, 13 designates etched parts and 15 designates oxidized films.

In this structure, bonding supports 12 are provided on both sides of and outside the mesa region 11 through which a current flows with the p-side down so as to be easy to mount. A summary of the manufacturing steps of this device shall be explained with reference to FIGS. 5A through 5G.

Figure 5A:
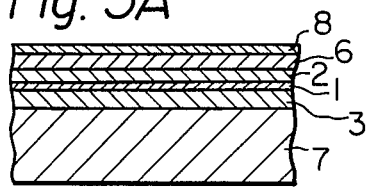
FIGS. 5A to 5G are explanatory views of manufacturing steps of the laser of the present invention.
Figure 5B:
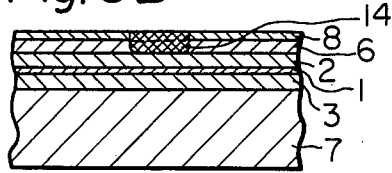
Figure 5C:
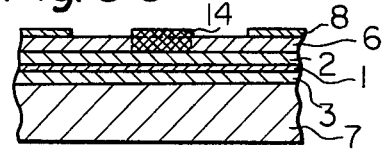
Figure 5D:
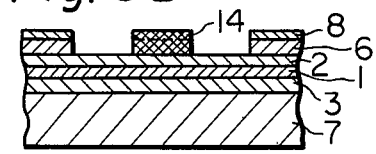

(i) As shown in FIG. 5A, on the n-type GaAs substrate 7, an epitaxial film of five layers of n-type $Al_{0.3}Ga_{0.7}As$ of a thickness of 5 $\mu$m as the first layer 3, p-type GaAs of a thickness of 0.3 $\mu$m as the second layer 1, p-type $Al_{0.2}Ga_{0.8}As$ of a thickness of 0.4 $\mu$m as the third layer 2, p-type $Al_{0.4}Ga_{0.6}As$ of a thickness of 1 $\mu$m as the fourth layer 6 and n-type GaAs of a thickness of 0.7 $\mu$m as the fifth layer 8 is grown in a liquid phase by an ordinary slide board method.

Then, though omitted in FIG. 5A to avoid any complication of the drawing, $SiO_2$ is formed to be of a thickness of 0.1 to 0.2 μm as a diffused mask by means of a radio frequency spattering.

(ii)  Zn is selectively diffused to the first and second layers to form the diffused layer 14. The diffusion of Zn is stopped on the boundary surface between the third layer 2 and fourth layer 6 (see FIG. 5B).

(iii)  While not shown in the drawing, windows are made in the form of a stripe in a diffused mask of $SiO_2$ by photoetching, with which an etching of the n-type GaAs in the fifth layer 8 is made with a solution of $H_2O_2 + NH_4OH$. In this case, the Zn diffused layer 14 is not etched (see FIG. 5C).

(iv)  The fourth layer 6 of p-type $Al_{0.4}Ga_{0.6}As$ is etched with HF. The third layer 2 of p-type $Al_{0.2}Ga_{0.8}As$ is not etched (see FIG. 5D).

Figure 5E:
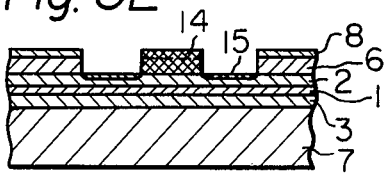

(v)  The oxidized film 15 for insulation is formed with $H_2O_2$ in the bottom of the groove formed by etching (see FIG. 5E).

Figure 5F:
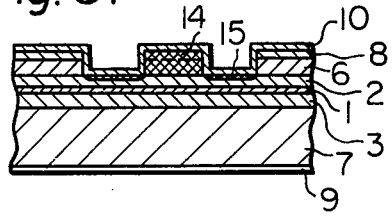

(vi)  Au - Cr on the "p" side and Au - Ge - Ni on the "n" side are formed to be of a thickness of about 0.5 μm on all the surfaces by an evaporating depositing method to form the ohmic contacts (see FIG. 5F).

On the "p" side, the etched part is insulated from the contact by the oxidized film of p-$Al_{0.2}Ga_{0.8}As$. Further, the bonding support 12 is of n-GaAs. When a voltage in the forward direction of the p-n junction is applied between the mesa-region and substrate, no electric current will flow due to the reverse pressure resistance of the p-n junction between the fourth layer 6 and fifth layer 8. Therefore, as shown in FIG. 5F. the contact 10 may well be formed all over the surface.

(vii)  End surfaces opposed vertically to the stripe and p-n junction are formed by a cleavage.

Figure 5G:
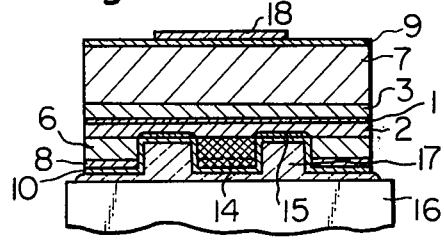

(viii)  Thus formed structure is fitted with indium forming a complementary layer 17 on a diamond heat sink 16 to radiate heat with the "p" side down, and a lead wire 18 is provided on the contact 9 so that an electric current in forward direction can be fed (see FIG. 5G).

In the above embodiment, the buffer layer 2 and mode controlling semiconductor layer 6 are disclosed as being made of respectively different compositions, However, they can be made of the same composition by controlling the etching velocity.

Now, examples of results of experiments of measuring the characteristics in the transverse mode of this semiconductor laser having the structure of FIG. 4 are shown in FIGS. 6 and 7, wherein:

Optical waveguide active layer:
  GaAs 0.3 μm thick.
Buffer layer:
  $Al_{0.2}Ga_{0.8}As$ 0.4 μm thick.
Mode controlling semiconductor layer:
  $Al_{0.4}Ga_{0.6}As$ 1 μm thick and 10 μm wide.
Optical confinement layer:
  $Al_{0.3}Ga_{0.7}As$ 5 μm thick.
Substrate:
  GaAs about 70 μm thick.
Contact forming semiconductor cap layer:
  GaAs 0.7 μm thick.
Waveguide width:
  10 μm.
Whole device dimensions:
  Dimension between the cleaved surfaces:
    About 250 μm.
  Thickness:
    About 76 μm.
  Dimension in the direction vertical to the p-n junction and stripe:
    About 300 μm.

Figure 6A:
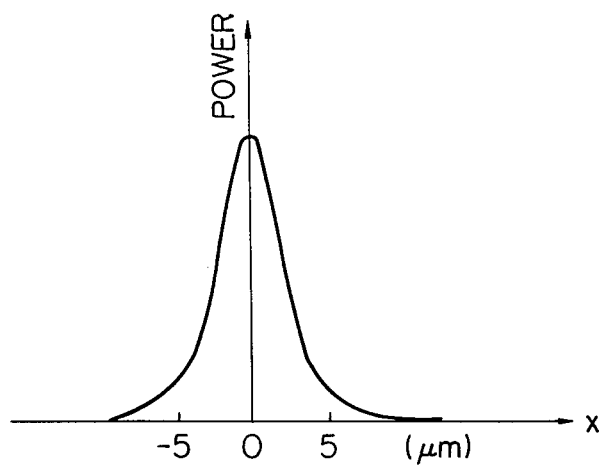
Figure 6B:
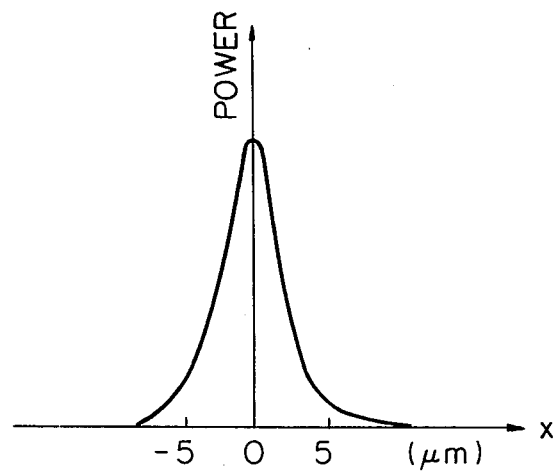

The oscillation threshold current of this laser was about 120mA. FIGS. 6A and 6B show a near-field pattern in the direction x of the mirror surface. The measuring was made by means of a generally known method by using a galvanometer mirror as disclosed in an article titled "Optical Waveguiding in Proton-Implanted GaAs" by E. Garmire et al. in Appl. Phys. Letters, Vol. 21, 1972, page 87. The abscissa represents the distance in the direction x and the ordinate represents the power distribution, i.e., the near-field pattern. FIG. 6A is of the case of an operating current of 300mA, whereas FIG. 6B is the case of 125mA.

Figure 7A:
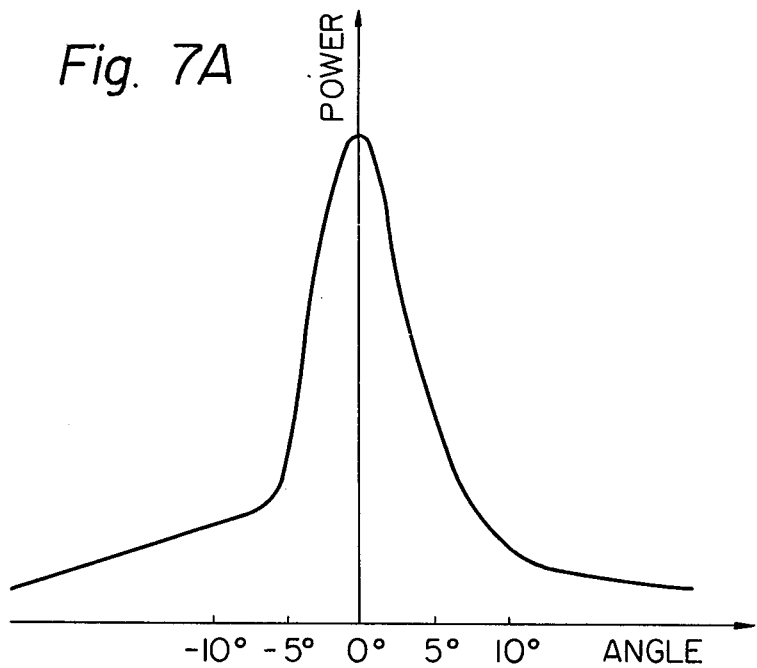
Figure 7B:
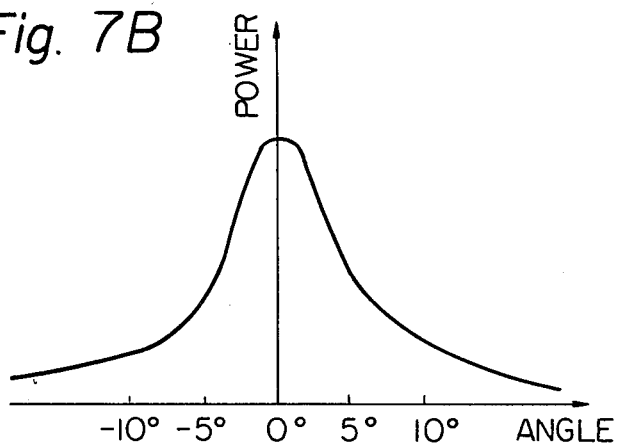

FIGS. 7A and 7B show a far-field pattern, in which FIG. 7A is of the case of an operating current of 300mA and FIG. 7B is of the case of 200mA. The angle is taken on the abscissa and the power distribution is taken on the ordinate. The oscillation threshold current is 120mA.

The present invention is featured in the following respects:

(1) A stable single transverse mode oscillation is possible by the control of the mode by means of the equivalent refractive index difference.

(2) As a stable single mode characteristics will be obtained even if the stripe width is large (about 10 μm) or the operating current becomes several times as high as the threshold value, it is possible to manufacture a single mode laser of a large output.

(3) The manufacture is made easy by the employment of such measures as the selective etching of the composition, insulation with an oxidized film of AlGaAs and the like.

(4) As the active layer is not subjected to any working, a semiconductor laser of a long life can be manufactured.

While the foregoing description has been made with reference to a semiconductor laser of double heterostructure made of GaAs — AlGaAs series materials, it should be understood that the structure of the present invention is applicable in the same manner to any double heterostructure of InGaAs, InGaAsP, AlGaAsP or AlGaAsSb series materials, as long as the refractive indexes of the respective semiconductor layers satisfy the foregoing formula(1).

What is claimed is:

1. A single transverse mode semiconductor laser which comprises a semiconductor structure having optical resonator defining parallel opposed surfaces, said semiconductor structure comprising:

(a) a semiconductor substrate of a first conduction type;

(b) an optical confinement semiconductor layer of the first conduction type that is provided on said semiconductor substrate and has a refractive index of $n_3$;

(c) an optical waveguide active semiconductor layer that is provided on said optical confinement semiconductor layer and has a refractive index of $n_1$;

(d) a buffer semiconductor layer of a second conduction type that is provided on said optical waveguide active semiconductor layer, and has a refractive index of $n_2$;

(e) a mode controlling striped semiconductor layer of the second conduction type that is provided on said buffer semiconductor layer, has a width $a$, and has a refractive index of $n_6$;

(f) a contact forming semiconductor cap layer of the second conduction type that is provided on said mode controlling striped semiconductor layer;

(g) a first ohmic contact provided on said contact forming semiconductor cap layer; and (h) a second ohmic contact provided on the bottom surface of said substrate;

wherein said refractive indexes satisfy the relations:

$$n_6 \leq n_2 < n_1 \text{ and } n_3 < n_1; \text{ and}$$

said width $a$ of said mode controlling striped semiconductor layer satisfies the relation:

$$a \leq \lambda_o/(2n_1\sqrt{2\Delta n}),$$

where $\lambda_o$ is the wavelength of propagated light in free space and $\Delta n$ is a specific equivalent refractive index difference given by:

$$\Delta n = 1 - \sqrt{1 - \frac{n_A^2 - n_B^2}{n_1^2}},$$

wherein $n_A$ is a standardized propagation for a first region, said first region including said mode controlling striped semiconductor layer and the portions of said optical confinement, optical waveguide, and buffer semiconductor layers that lie beneath said mode controlling striped semiconductor layer, and $n_B$ is a standardized propagation constant for a second region, said second region including the portions of said optical confinement, optical waveguide active, and buffer semiconductor layers that are adjacent to said first region.

2. A semiconductor laser according to claim 1 wherein said optical waveguide active semiconductor layer is up to about 0.5 μm thick.

3. A semiconductor laser according to claim 1 wherein said optical waveguide active semiconductor layer is about 0.2–0.5 μm thick, said width $a$ of said mode controlling striped semiconductor layer is about 3–10 μm, and said buffer semiconductor layer is about 0.2–0.5 μm thick.

4. A semiconductor laser according to claim 1 wherein said optical waveguide active semiconductor layer is about 0.3 μm thick, said buffer semiconductor layer is about 0.4 μm thick, and said mode controlling striped semiconductor layer is about 5.0 μm wide.

5. A single transverse mode semiconductor laser which comprises a semiconductor structure having optical resonator defining parallel opposed surfaces, said semiconductor structure comprising:

(a) a GaAs substrate of a first conduction type;

(b) an $Al_{(w)}Ga_{(1-w)}As$ optical confinement layer of the first conduction type that is provided on said semiconductor substrate and has a refractive index of $n_3$;

(c) an $Al_{(x)}Ga_{(1-x)}As$ optical waveguide active layer that is provided on said optical confinement semiconductor layer, is up to about 0.5 μm thick, and has a refractive index of $n_1$;

(d) an $Al_{(y)}Ga_{(1-w)}As$ buffer layer of a second conduction type that is provided on said optical waveguide active semiconductor layer, and has a refractive index of $n_2$;

(e) an $Al_{(z)}Ga_{(1-z)}As$ mode controlling striped semiconductor layer of the second conduction type that is provided on said buffer semiconductor layer, has a width $a$, and has a refractive index of $n_6$;

(f) a contact forming semiconductor cap layer of the second conduction type that is provided on said mode controlling striped semiconductor layer;

(g) a first ohmic contact provided on said contact forming semiconductor cap layer; and (h) a second ohmic contact provided on the bottom surface of said substrate;

wherein the values of $w$, $x$, $y$ and $z$ are selected so that said refractive indexes satisfy the relations:

$$n_6 \leq n_2 < n_1 \text{ and } n_3 < n_1; \text{ and}$$

said width $a$ of said mode controlling striped semiconductor layer satisfies the relation:

$$a \leq \lambda_o/(2n_1\sqrt{2\Delta n}),$$

where $\lambda_o$ is the wavelength of propagated light in free space and $\Delta n$ is a specific equivalent refractive index difference given by:

$$\Delta n = 1 - \sqrt{1 - \frac{n_A^2 - n_B^2}{n_1^2}},$$

where $n_A$ is a standardized propagation for a first region, said first region including said mode controlling striped semiconductor layer and the portions of said optical confinement, optical waveguide, and buffer semiconductor layers that lie beneath said mode controlling striped semiconductor layer, and $n_B$ is a standardized propagation constant for a second region, said second region including the portions of said optical confinement optical waveguide active, and buffer semiconductor layers that are adjacent to said first region.

6. A semiconductor laser according to claim 5 wherein $x = 0$, $w = 0.3$, $y = 0.2$, and $z = 0.4$.

7. A semiconductor laser according to claim 6 wherein said buffer layer is about 0.2–0.5 μm thick and said mode controlling striped layer has a width $a$ of about 3–8 μm, and said optical waveguide layer is about 0.2–0.5 μm thick.

8. A semiconductor laser according to claim 6 wherein said optical waveguide active layer is about 0.3 μm thick, said mode controlling striped layer has a width $a$ of about 5 μm, and said buffer semiconductor layer is about 0.4 μm thick.

9. A semiconductor laser according to claim 5 wherein $x = 0$, $w = 0.3$, $y = 0.2$ and $z = 0.5$.

10. A semiconductor laser according to claim 5, wherein $w = 0.3$, $0 < x \leq 0.1$, $y = 0.2$, and $z = 0.5$.

11. A semiconductor laser according to claim 10 wherein said optical confinement layer is n type $Al_{0.3}Ga_{0.7}As$, said optical waveguide active layer is p-type $Al_xGa_{(1-x)}As$, said buffer layer is p-type $Al_{0.2}Ga_{0.8}As$, and said mode controlling striped layer is p-type $Al_{0.5}Ga_{0.5}As$.

12. A semiconductor laser according to claim 5 wherein $w = 0.3$, $0 < x \leq 0.1$, $y = 0.2$, and $z = 0.04$.

13. A semiconductor laser according to claim 12 wherein said optical confinement layer is n-type $Al_{0.3}Ga_{0.7}As$, said optical waveguide active layer is p-type $Al_xGa_{(1-x)}As$, said buffer layer is p-type $Al_{0.2}Ga_{0.8}As$, and said mode controlling striped layer is p-type $Al_{0.4}Ga_{0.6}As$.

14. A semiconductor laser according to claim 13 wherein said optical waveguide active layer is about 0.2 to about 0.5 μm thick, said mode controlling striped semiconductor layer has a width $a$ of about 3 μm to about 8 μm, and said buffer layer has a thickness of about 0.2 μm to about 0.5 μm.

15. A semiconductor laser according to claim 13 wherein said optical waveguide active layer is about 0.3 μm thick, said mode controlling striped layer is about 5.0 μm wide, and said buffer layer is about 0.4 μm thick.

* * * * *